United States Patent
Sun et al.

(10) Patent No.: US 12,550,573 B2
(45) Date of Patent: Feb. 10, 2026

(54) LIGHT-EMITTING DEVICE AND MANUFACTURING METHOD THEREOF, DISPLAY PANEL AND MANUFACTURING METHOD THEREOF, AND DISPLAY APPARATUS

(71) Applicant: BOE TECHNOLOGY GROUP CO., LTD., Beijing (CN)

(72) Inventors: Meng Sun, Beijing (CN); Cheng Han, Beijing (CN); Shuyun Xu, Beijing (CN); Xiaobo Du, Beijing (CN); Yansong Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 713 days.

(21) Appl. No.: 17/798,326

(22) PCT Filed: Sep. 13, 2021

(86) PCT No.: PCT/CN2021/118017
§ 371 (c)(1),
(2) Date: Aug. 9, 2022

(87) PCT Pub. No.: WO2022/083356
PCT Pub. Date: Apr. 28, 2022

(65) Prior Publication Data
US 2023/0100390 A1 Mar. 30, 2023

(30) Foreign Application Priority Data
Oct. 21, 2020 (CN) .......................... 202011133811.0

(51) Int. Cl.
*H10K 59/35* (2023.01)
*H10K 59/122* (2023.01)
(Continued)

(52) U.S. Cl.
CPC ......... *H10K 59/353* (2023.02); *H10K 59/122* (2023.02); *H10K 59/60* (2023.02); *H10K 71/00* (2023.02)

(58) Field of Classification Search
CPC .... H10K 59/353; H10K 59/122; H10K 59/60; H10K 50/813; H10K 50/125; H10K 59/12
See application file for complete search history.

(56) References Cited

U.S. PATENT DOCUMENTS

2006/0028124 A1 2/2006 Chu et al.
2014/0306241 A1 * 10/2014 Hirakata .............. H10K 50/822
257/79
(Continued)

FOREIGN PATENT DOCUMENTS

CN 104103673 A 10/2014
CN 104716164 A 6/2015
(Continued)

OTHER PUBLICATIONS

First Office Action on the Chinese Patent Application No. 202011133811.0 issued by the Chinese Patent Office on Aug. 16, 2023.

*Primary Examiner* — Thanh Y. Tran
(74) *Attorney, Agent, or Firm* — XSENSUS LLP

(57) ABSTRACT

A light-emitting device includes a first electrode, a light-emitting function pattern and a second electrode. The first electrode has at least one first depression portion. The light-emitting function pattern is disposed on the first electrode, the light-emitting function pattern covers at least the first depression portion(s), and a portion of the light-emitting function pattern covering a first depression portion is conformal to the first depression portion.

15 Claims, 13 Drawing Sheets

(51) Int. Cl.
*H10K 59/60* (2023.01)
*H10K 71/00* (2023.01)

(56) References Cited

U.S. PATENT DOCUMENTS

| | | | |
|---|---|---|---|
| 2015/0362776 A1* | 12/2015 | Jikumaru | H10K 50/865 |
| | | | 349/12 |
| 2016/0260789 A1 | 9/2016 | Zhang | |
| 2017/0278913 A1 | 9/2017 | Zhang | |
| 2019/0074337 A1 | 3/2019 | Xie et al. | |
| 2020/0066804 A1 | 2/2020 | Jung et al. | |
| 2022/0199680 A1* | 6/2022 | Lee | H10K 59/875 |

FOREIGN PATENT DOCUMENTS

| CN | 205029905 U | 2/2016 |
|---|---|---|
| CN | 107403811 A | 11/2017 |
| CN | 207303093 U | 5/2018 |
| CN | 112133844 A | 12/2020 |
| CN | 212810345 U | 3/2021 |

* cited by examiner

LIGHT-EMITTING DEVICE AND MANUFACTURING METHOD THEREOF, DISPLAY PANEL AND MANUFACTURING METHOD THEREOF, AND DISPLAY APPARATUS

CROSS-REFERENCE TO RELATED APPLICATIONS

This application is a national phase entry under 35 USC 371 of International Patent Application No. PCT/CN2021/118017, filed on Sep. 13, 2021, which claims priority to Chinese Patent Application No. 202011133811.0, filed on Oct. 21, 2020, which are incorporated herein by reference in their entirety.

TECHNICAL FIELD

The present disclosure relates to the field of display technologies, and in particular, to a light-emitting device and a manufacturing method thereof, a display panel and a manufacturing method thereof and a display apparatus.

BACKGROUND

An organic light-emitting diode (OLED) is also referred to as an organic electroluminescent display device or organic light-emitting semiconductor. The OLEDs may be applied to a display apparatus to obtain an OLED display apparatus. Since the OLED display apparatus has superior properties such as self-luminescence, no need for a backlight source, high contrast, thin thickness, wide viewing angle, fast response speed, applicability to a flexible panel, a wide temperature range for using, a simple structure and a simple process, it is considered to become a mainstream of next-generation display apparatuses. The OLEDs may also be applied to a lamp to obtain an OLED lamp. Due to the properties of the OLED device, the OLED lamp may be made as a flexible surface light source, so that the OLED lamp has a better lighting effect.

SUMMARY

In an aspect, a light-emitting device is provided. The light-emitting device includes a first electrode, a light-emitting function pattern and a second electrode. The first electrode has at least one first depression portion. The light-emitting function pattern is disposed on the first electrode, the light-emitting function pattern covers at least the at least one first depression portion, and a portion of the light-emitting function pattern covering a first depression portion is conformal to the first depression portion.

In some embodiments, in a thickness direction of the light-emitting device, an edge of a longitudinal section of the first depression portion proximate to the light-emitting function pattern includes an arc line and/or polyline.

In some embodiments, a surface of the first depression portion proximate to the light-emitting function pattern has a depression; and in the thickness direction of the light-emitting device, a section of the depression of the surface of the first depression portion is in a shape of any one of a semicircle, a semi-ellipse, an inverted triangle, an inverted trapezoid and a rectangle.

In some embodiments, the light-emitting device further includes a second electrode disposed opposite to the first electrode. The light-emitting function pattern is located between the first electrode and the second electrode.

In another aspect, a display panel is provided, and the display panel includes at least one light-emitting device according to any one of the above embodiments.

In some embodiments, the display panel has a plurality of sub-pixels emitting light of different colors; and in the sub-pixels, at least part of sub-pixels emitting blue light each include a light-emitting device in the at least one light-emitting device.

In some embodiments, the at least one light-emitting device includes a plurality of light-emitting devices; and the display panel further includes a planarization layer disposed on a side of first electrodes of the plurality of light-emitting devices away from light-emitting function patterns of the plurality of light-emitting devices. The planarization layer includes a plurality of second depression portions, the first depression portion is located on a second depression portion in the plurality of second depression portions, and a surface of the first depression portion proximate to the second depression portion is conformal to a surface of the second depression portion proximate to the first depression portion.

In some embodiments, the planarization layer is made of a photosensitive material.

In some embodiments, the at least one light-emitting device includes a plurality of light-emitting devices; and the display panel further includes a pixel defining layer disposed on first electrodes of the light-emitting devices. The pixel defining layer includes a plurality of hollows, and a hollow in the plurality of hollows exposes at least the at least one first depression portion of the first electrode.

In some embodiments, the at least one light-emitting device includes a plurality of light-emitting devices, second electrodes of the light-emitting devices are coupled.

In yet another aspect, a display apparatus is provided. The display apparatus includes the display panel as described in any one of the above embodiments.

In yet another aspect, a manufacturing method of a light-emitting device is provided. The manufacturing method includes: forming a first electrode, the first electrode having at least one first depression portion; and forming a light-emitting function pattern on the first electrode, the light-emitting function pattern covering at least the at least one first depression portion, and a portion of the light-emitting function pattern covering a first depression portion being conformal to the first depression portion.

In some embodiments, before forming the first electrode, the manufacturing method of the light-emitting device further includes: forming a planarization pattern. The planarization pattern includes at least one second depression portion, the first depression portion is located on a second depression portion, and a surface of the first depression portion proximate to the second depression portion is conformal to a surface of the second depression portion proximate to the first depression portion.

In some embodiments, the manufacturing method of the light-emitting device further includes: forming a second electrode on the light-emitting function pattern, the second electrode being disposed opposite to the first electrode.

In another aspect, a manufacturing method of a display panel is provided. The manufacturing method includes: forming a first electrode layer, the first electrode layer including a plurality of first electrodes, and each first electrode in the plurality of first electrodes having at least one first depression portion; and forming a light-emitting function layer on the first electrode layer, the light-emitting function layer including a plurality of light-emitting function patterns, a light-emitting function pattern in the plurality of light-emitting function patterns covering at least the at least one first depression portion of a first electrode, and a portion of the light-emitting function pattern covering a first depression portion being conformal to the first depression portion.

In some embodiments, before forming the first electrode layer, the manufacturing method, the manufacturing method of the display panel further includes: forming a planarization layer. The planarization layer includes a plurality of second depression portions, the first depression portion is located on a second depression portion in the plurality of second depression portion, and a surface of the first depression portion proximate to the second depression portion is conformal to a surface of the second depression portion proximate to the first depression portion.

In some embodiments, forming the planarization layer includes: forming a planarization film of a photosensitive material, and patterning the planarization film to form the planarization layer including the plurality of second depression portions.

In some embodiments, patterning the planarization film to form the planarization layer including the plurality of second depression portions, includes: exposing regions of the planarization film where the second depression portions are to be formed.

In an exposure process, an exposure time for a middle region in each region where the second depression portion is to be formed is longer than an exposure time for an edge region except for the middle region in the region where the second depression portion is to be formed; or an exposure intensity for the middle region in each region where the second depression portion is to be formed is greater than an exposure intensity for the edge region except for the middle region in the region where the second depression portion is to be formed.

In some embodiments, after forming the light-emitting function layer, the manufacturing method further includes: forming a second electrode layer on the light-emitting function layer, the second electrode layer being opposite to the first electrode layer.

In some embodiments, in a thickness direction of the display panel, an edge of a longitudinal section of the first depression portion proximate to the light-emitting function layer includes an arc line and/or polyline.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, but are not limitations on actual sizes of products and actual processes of methods involved in the embodiments of the present disclosure.

DETAILED DESCRIPTION

Figure 1:
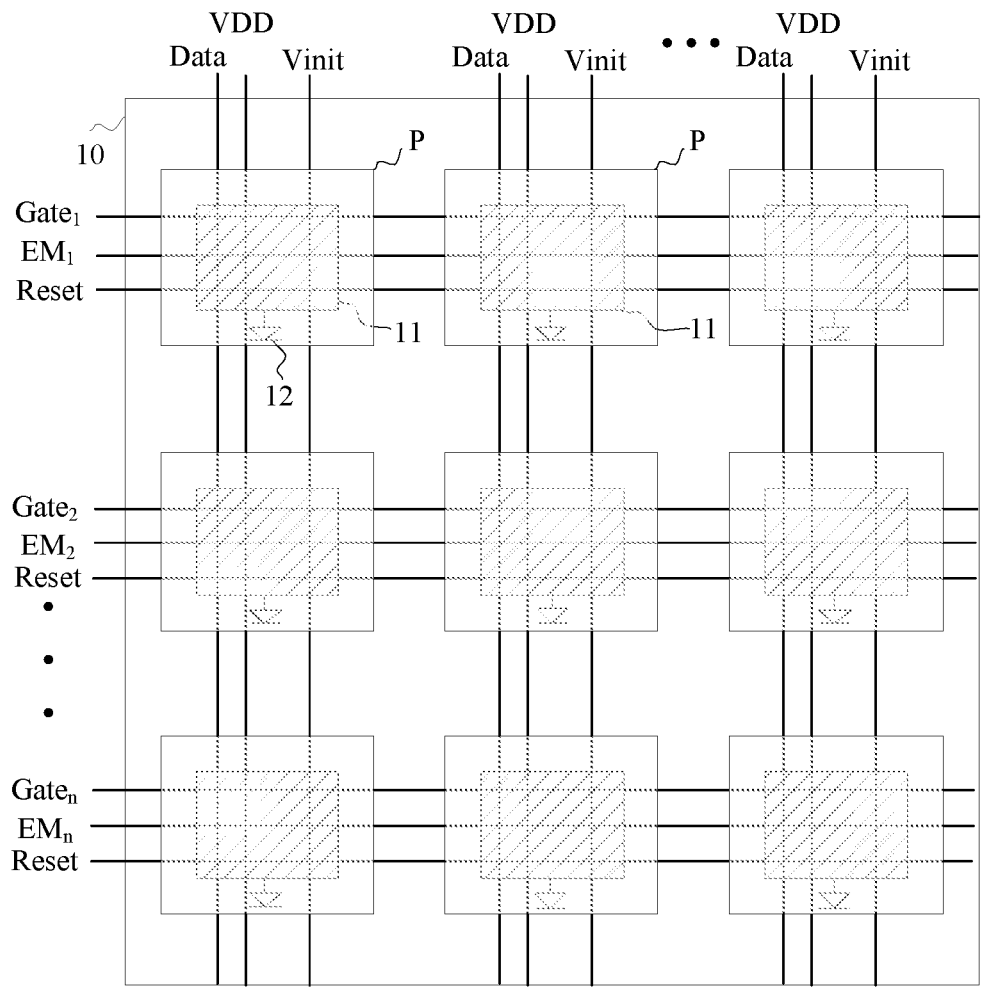
FIG. 1 is a structural diagram of a display panel, in accordance with some embodiments of the present disclosure.

Technical solutions in some embodiments of the present disclosure will be described clearly and completely below with reference to the accompanying drawings. However, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, terms such as "one embodiment", "some embodiments", "exemplary embodiments", "an example", "a specific example" or "some examples" are intended to indicate that specific features, structures, materials or characteristics related to the embodiment(s) or example(s) are included in at least one embodiment or example of the present disclosure. Schematic representation of the above term does not necessarily refer to the same embodiment(s) or examples(s). In addition, specific features, structures, materials, or characteristics may be included in any one or more embodiments or examples in any suitable manner.

Hereinafter, the terms such as "first" and "second" are used for descriptive purposes only, but are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of" or "the plurality of" means two or more unless otherwise specified.

In the description of some embodiments, terms such as "coupled" and "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

The phrase "at least one of A, B, and C" has the same meaning as the phrase "at least one of A, B, or C", and they both include the following combinations of A, B, and C: only A, only B, only C, a combination of A and B, a combination of A and C, a combination of B and C, and a combination of A, B and C.

The phrase "A and/or B" includes following three combinations: only A, only B, and a combination of A and B.

As used herein, depending on the context, the term "if" is optionally construed as "when", "in a case where", "in response to determining" or "in response to detecting". Similarly, the phrase "if it is determined" or "if [a stated condition or event] is detected" is optionally construed as "in a case where it is determined" or "in response to determining" or "in a case where [the stated condition or event] is detected" or "in response to detecting [the stated condition or event]", depending on the context.

The phrase "applicable to" or "configured to" used herein means an open and inclusive expression, which does not exclude devices that are applicable to or configured to perform additional tasks or steps.

In addition, the phrase "based on" used herein is meant to be open and inclusive, since a process, step, calculation, or other action that is "based on" one or more of the stated conditions or values may, in practice, be based on additional conditions or values other than those stated.

As used herein, terms such as "about" or "approximately" include a stated value and an average value within an acceptable range of deviation of a particular value. The acceptable range of deviation is determined by a person of ordinary skill in the art in view of the measurement in question and errors associated with the measurement of a particular quantity (i.e., the limitations of the measurement system).

As used herein, same reference numbers refer to both a signal terminal and a signal provided by the signal terminal.

Exemplary embodiments are described herein with reference to sectional views and/or plan views as idealized exemplary accompanying drawings. In the accompanying drawings, thickness of layers and sizes of regions are enlarged for clarity. Variations in shapes relative to the drawings due to, for example, manufacturing technologies and/or to tolerances may be envisaged. Therefore, the exemplary embodiments should not be construed as being limited to the shapes of the regions shown herein, but including deviations due to, for example, manufacturing. For example, an etched region shown in a rectangular shape generally has a feature of being curved. Therefore, the regions shown in the accompanying drawings are schematic in nature, and their shapes are not intended to show actual shapes of the regions in an apparatus, and are not intended to limit the scope of the exemplary embodiments.

Embodiments of the present disclosure provide an OLED display apparatus. The OLED display apparatus includes, for example, a display pane. For example, referring to FIG. 1, the display panel 1 includes a substrate 10 and a plurality of sub-pixels P disposed on the substrate 10; each sub-pixel P includes a driving circuit 11 and a light-emitting device 12 that are coupled, and the driving circuit 11 is configured to drive the light-emitting device 12 to emit light.

Figure 2A:
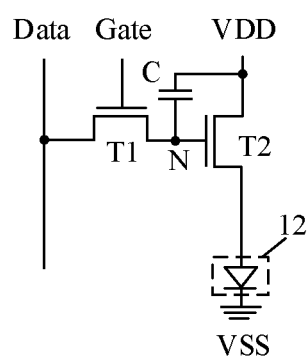
FIG. 2A is a structural diagram of a pixel driving circuit, in accordance with some embodiments of the present disclosure.
Figure 2B:
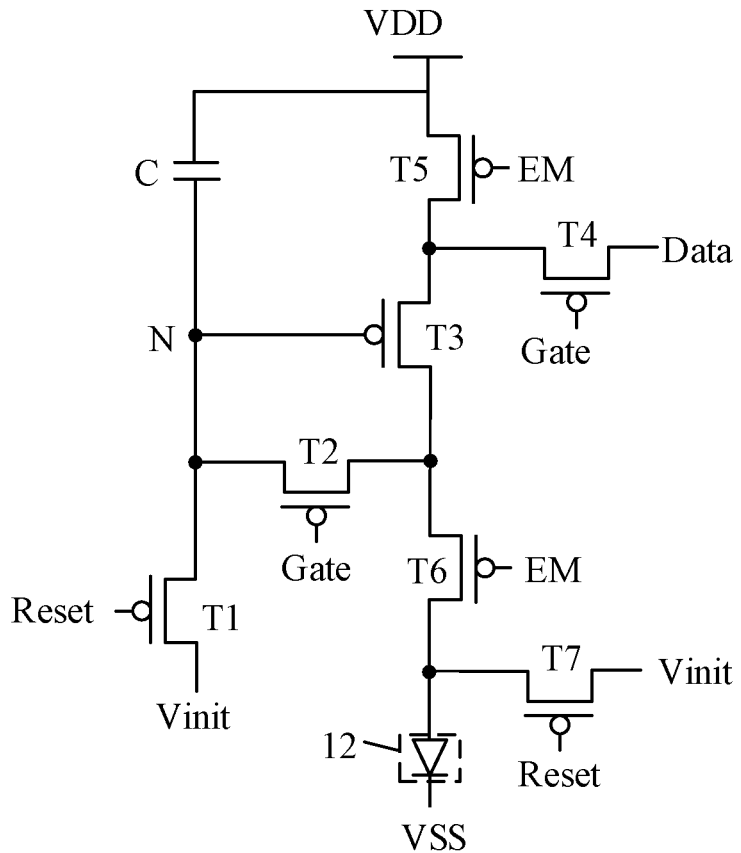
FIG. 2B is a structural diagram of another pixel driving circuit, in accordance with some embodiments of the present disclosure.

For example, referring to FIGS. 2A and 2B, the driving circuit 11 drives the light-emitting device 12 to emit light in an active driving manner. In this case, the driving circuit 11 may be referred to as a pixel driving circuit.

In some embodiments, referring to FIG. 2A, the pixel driving circuit includes a transistor T1, a transistor T2, and a capacitor C. The transistor T2 is a driving transistor.

A gate of the transistor T1 is coupled to a gate signal terminal Gate, a first electrode of the transistor T1 is coupled to a data signal terminal Data, and a second electrode of the transistor T1 is coupled to a node N. A gate of the transistor T2 is coupled to the node N, a first electrode of the transistor T2 is coupled to a power supply voltage signal terminal VDD, and a second electrode of the transistor T2 is coupled to the light-emitting device 12. A terminal of the capacitor C is coupled to the power supply voltage signal terminal VDD, and another terminal of the capacitor C is coupled to the node N.

For example, a working principle of the pixel driving circuit is as follows. In a data writing period, the transistor T1 is turned on under control of a gate signal of the gate signal terminal Gate, so as to transmit a data signal provided by the data signal terminal Data to the node N, and charge the capacitor C. In a light-emitting period, the capacitor C discharges, a voltage of the node N continues to rise, so that the transistor T2 is turned on, and a driving signal is output by the transistor T2 to the light-emitting device 12 under control of a gate voltage and a source voltage of the transistor T2.

Referring to FIG. 2A, the gate voltage of the transistor T2 is equal to the voltage of the node N. The source voltage is, for example, equal to a voltage of a power supply voltage signal provided by the power supply voltage signal terminal VDD. The driving signal output from the transistor T2 to the light-emitting device 12 is, for example, a driving current.

In some other embodiments, referring to FIG. 2B, the pixel driving circuit includes a transistor T1, a transistor T2, a transistor T3, a transistor T4, a transistor T5, a transistor T6, a transistor T7 and a capacitor C. The transistor T3 is a driving transistor.

A gate of the transistor T1 is coupled to a reset signal terminal Reset, a first electrode of the transistor T1 is coupled to an initialization signal terminal Vinit, and a second electrode of the transistor T1 is coupled to a node N.

A gate of the transistor T2 is coupled to a gate signal terminal Gate, a first electrode of the transistor T2 is coupled to a second electrode of the transistor T3, and a second electrode of the transistor T2 is coupled to the node N.

A gate of the transistor T3 is coupled to the node N, a first electrode of the transistor T3 is coupled to a second electrode of the fifth transistor T5, and the second electrode of the transistor T3 is further coupled to a first electrode of the sixth transistor T6.

A gate of the transistor T4 is coupled to the gate signal terminal Gate, a first electrode of the transistor T4 is coupled to a data signal terminal Data, and a second electrode of the transistor T4 is coupled to the first electrode of the third transistor T3.

A gate of the transistor T5 is coupled to a light-emitting control signal terminal EM, and a first electrode of the transistor T5 is coupled to a power supply voltage signal terminal VDD.

A gate of the transistor T6 is coupled to the light-emitting control signal terminal EM, and a second electrode of the transistor T6 is coupled to an anode of the light-emitting device 12.

A gate of the transistor T7 is coupled to the reset signal terminal Reset, a first electrode of the transistor T7 is coupled to the initialization signal terminal Vinit, and a second electrode of the transistor T7 is coupled to the anode of the light-emitting device 12.

A terminal of the capacitor C is coupled to the power supply voltage signal terminal VDD, and another terminal of the capacitor C is coupled to the node N.

A cathode of the light-emitting device 12 is coupled to another power supply voltage signal terminal VSS. A voltage provided by the power supply voltage signal terminal VSS is different from the voltage provided by the power supply voltage signal terminal VDD.

For example, the voltage of the power supply voltage signal provided by the power supply voltage signal terminal VDD is in a range of 5 V to 15 V, inclusive; the voltage of a power supply voltage signal provided by the power supply voltage signal terminal VSS is 0 V.

For example, a working process of the pixel driving circuit includes the following periods.

In a reset period, the transistor T1 and the transistor T7 are turned on under control of a reset signal provided by the reset signal terminal Reset, so as to transmit an initialization signal provided by the initialization signal terminal Vinit to the gate electrode of the driving transistor T3 and the anode of the light-emitting device 12 to reset the gate of the driving transistor T3 and the anode of the light-emitting device 12.

In a data writing period, the transistor T2 and the transistor T4 are turned on under control of a gate signal provided by the gate signal terminal Gate, so that a data signal provided by the data signal terminal Data is transmitted to the gate of the transistor T3 through the transistor T4, the transistor T3 and the transistor T2, and the capacitor C is charged. In this case, the transistor T3 is in a self-saturation state. That is, a difference between a gate voltage Vg of the transistor T3 and a source voltage Vs (e.g., a voltage of the first electrode) of the transistor T3 is equal to a threshold voltage Vth of the transistor T3.

In a light-emitting period, the transistor T5 and the transistor T6 are turned on under control of a light-emitting control signal provided by the light-emitting control signal terminal EM, and the capacitor C discharges, so that the gate voltage of the transistor T3 further rises. The transistor T3 is turned on and outputs a driving signal to the light-emitting device 12, and the light-emitting device 12 starts to emit light. For example, the driving signal is the driving current, and a magnitude of the driving current is related to the gate voltage Vg of the transistor T3 and the power supply voltage provided by the power supply voltage signal terminal VDD.

Figure 2C:
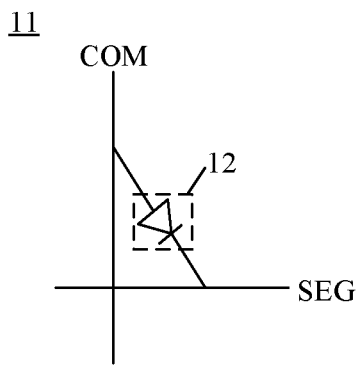
FIG. 2C is a structural diagram of a driving circuit, in accordance with some embodiments of the present disclosure.

In some embodiments, referring to FIG. 2C, the driving circuit 11 drives the light-emitting device 12 to emit light in a passive driving manner. The circuit adopting the passive driving manner includes, for example, a cathode line COM and an anode line SEG. The cathode line COM is coupled to the cathode of the light-emitting device 12, and the anode line SEG is coupled to the anode of the light-emitting device 12. For the display panel 1 including the driving circuit 11, an external driving chip is required to provide signals to the cathode line COM and the anode line SEG.

The above description mainly introduces the structure of the driving circuit 11, and a specific structure of the light-emitting device 12 will be described below.

Referring to FIGS. 3A, 3B, 3D, 3E, 3G, 3H, 3J, 3K and 3M, the light-emitting device 12 provided in some embodiments of the present disclosure includes a first electrode 121 and a light-emitting function pattern 122.

For example, the first electrode 121 is the anode. The first electrode 121 is, for example, made of a transparent conductive material, such as indium tin oxide (ITO).

Referring to FIGS. 3A to 3M, the first electrode 121 has at least one first depression portion 1210.

For example, referring to FIGS. 3A to 3M, in a thickness direction of the light-emitting device 12, an edge of a longitudinal section of the first depression portion 1210 proximate to the light-emitting function pattern 122 includes an arc line and/or polyline. Since the first depression portion 1210 has a thickness, the edge of the first depression portion 1210 proximate to the light-emitting function pattern 122 may be understood as an upper edge of the first depression portion 1210.

Figure 3A:
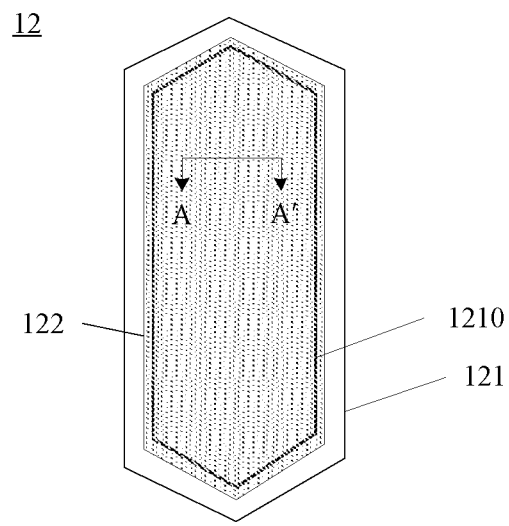
FIG. 3A is a top view showing a structure of a light-emitting device, in accordance with some embodiments of the present disclosure.
Figure 3B:
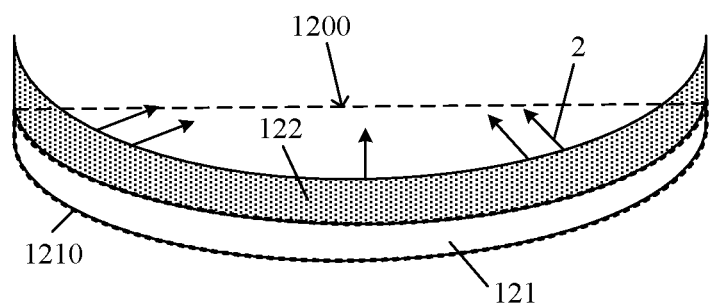
FIG. 3B is a sectional view of the light-emitting device taken along the direction A-A' in FIG. 3A.
Figure 3C:
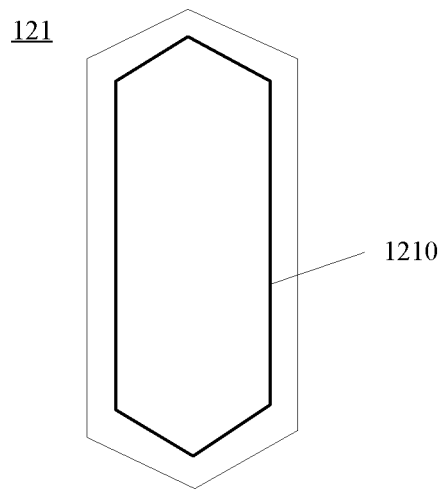
FIG. 3C is a structural diagram of a first electrode, in accordance with some embodiments of the present disclosure.
Figure 3D:
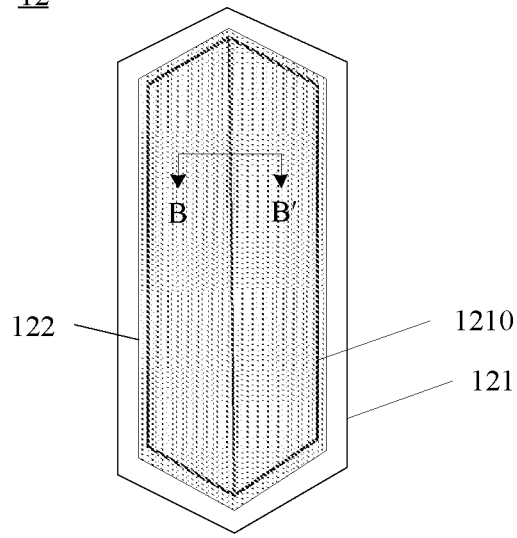
FIG. 3D is a top view showing a structure of another light-emitting device, in accordance with some embodiments of the present disclosure.
Figure 3E:
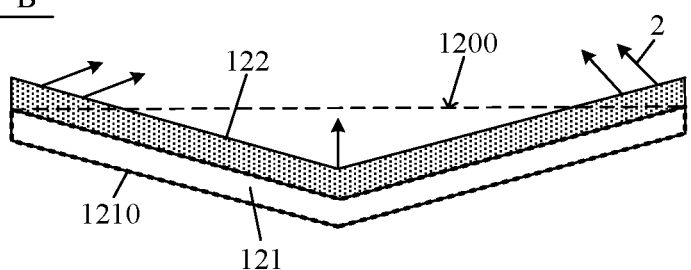
FIG. 3E is a sectional view of the light-emitting device taken along the direction B-B' in FIG. 3D.
Figure 3F:
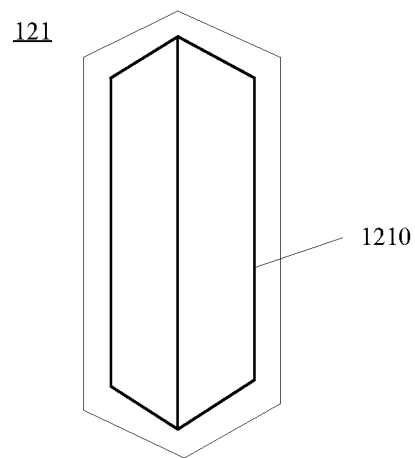
FIG. 3F is a structural diagram of another first electrode, in accordance with some embodiments of the present disclosure.
Figure 3G:
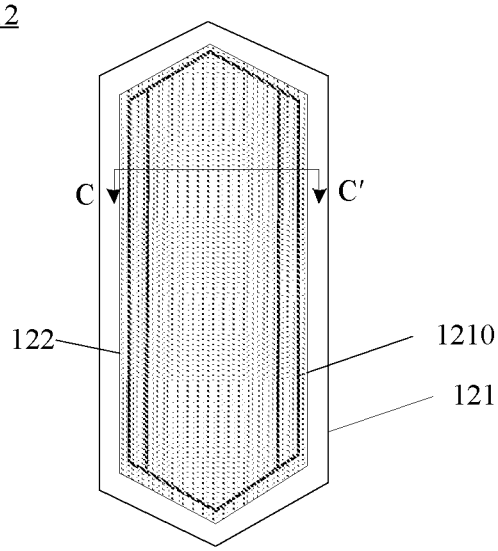
FIG. 3G is a top view showing a structure of yet another light-emitting device, in accordance with some embodiments of the present disclosure.
Figure 3H:
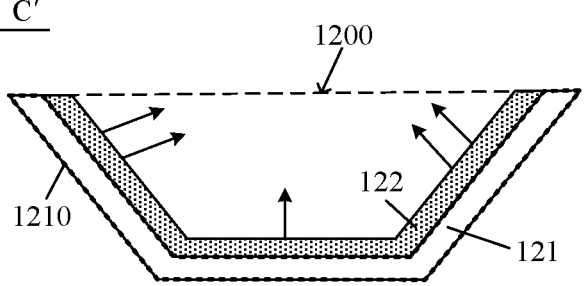
FIG. 3H is a sectional view of the light-emitting device taken along the direction C-C' in FIG. 3G.
Figure 3I:
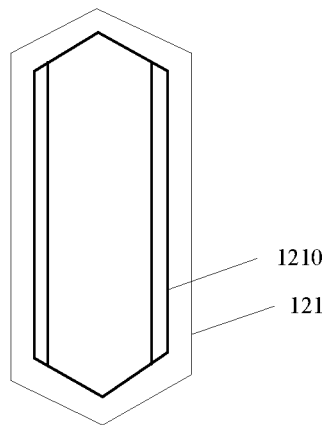
FIG. 3I is a structural diagram of yet another first electrode, in accordance with some embodiments of the present disclosure.
Figure 3J:
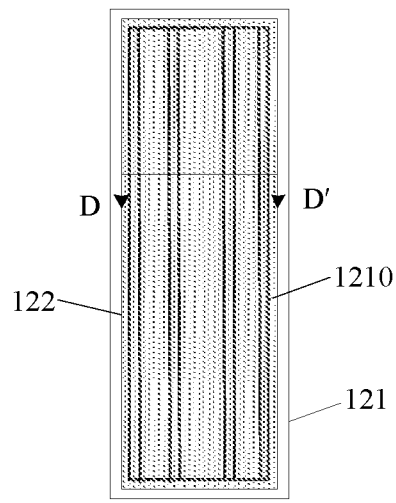
FIG. 3J is a top view showing a structure of yet another light-emitting device, in accordance with some embodiments of the present disclosure.
Figure 3K:
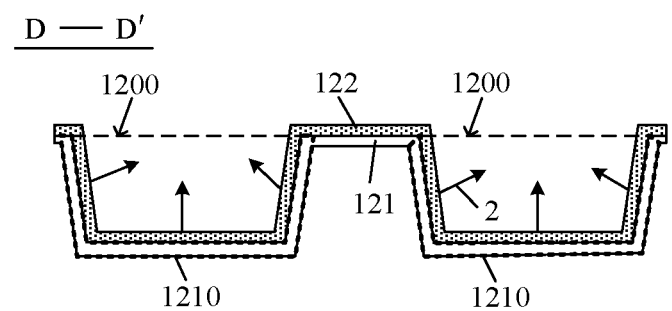
FIG. 3K is a sectional view of the light-emitting device taken along the direction D-D' in FIG. 3J.
Figure 3L:
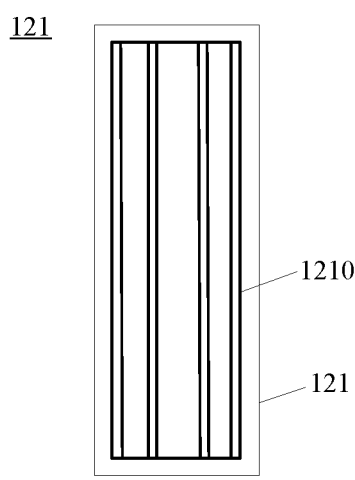
FIG. 3L is a structural diagram of yet another first electrode, in accordance with some embodiments of the present disclosure.

Referring to FIG. 3B, the upper edge of the first depression portion 1210 is the arc line; or referring to FIGS. 3E, 3H and 3K, the upper edge of the first depression portion 1210 is the polyline.

Since a thickness of the first electrode 121 is small, embodiments of the present disclosure are described by taking an example where the upper edge and a lower edge of the first depression portion 1210 have substantially same shapes. In actual, on a premise that a process may be achieved, referring to FIGS. 3B, 3E, 3H and 3K, it is only required to ensure that an upper surface of the first depression portion 1210 has a depression 1200. The upper surface of the first depression portion 1210 is a surface of the first depression portion 1210 proximate to the light-emitting function pattern 122.

In some embodiments, in the thickness direction of the light-emitting device 12, a section of the depression 1200 of the upper surface of the first depression portion 1210 is in a shape of any one of a semicircle, a semi-ellipse, an inverted triangle, an inverted trapezoid and a rectangle.

Figure 3M:
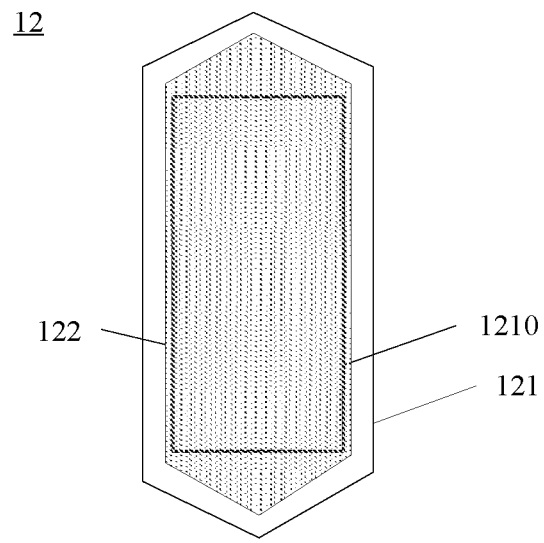
FIG. 3M is a top view showing a structure of yet another light-emitting device, in accordance with some embodiments of the present disclosure.

For example, in the thickness direction of the light-emitting device 12, referring to FIG. 3B, a longitudinal section of the depression 1200 of the first depression portion 1210 is in the shape of the semi-ellipse. Referring to FIG. 3E, the longitudinal section of the depression 1200 of the first depression portion 1210 is in the shape of the inverted triangle. Referring to FIGS. 3H and 3K, the longitudinal section of the depression 1200 of the first depression portion 1210 is in the shape of the inverted trapezoid. It will be noted that, the shape of the longitudinal section of a same first depression portion 1210 may correspond to different top views of the first depression portion 1210. For example, referring to FIG. 3H, the longitudinal section of the depression 1200 of the first depression portion 1210 is in the shape of the inverted trapezoid, while the top view corresponding to the first depression portion 1210 may be as shown in FIG. 3G or 3M. Therefore, some specific shapes of the longitudinal section and top view of the first depression portion 1210 are illustrated here, but the embodiments of the present disclosure does not limited thereto. Other shapes of the longitudinal section of the first depression portion 1210 may also be applicable to the embodiments of the present disclosure. That is, the shapes of the first depression portion 1210 applicable to the embodiments of the present disclosure are not exhaustive. Therefore, the shapes of the first depression portion 1210 listed in the embodiments of the present disclosure are only for illustration.

It will be noted that, in FIGS. 3E, 3H and 3K, in a case where the thickness of the first depression portion 1210 is ignored, the shape of the longitudinal section of the depression 1200 of the first depression portion 1210 is not a complete triangle or a complete inverted trapezoid, but the triangle and the inverted trapezoid each have an opening, which does not affect those skilled in the art to understand the shape of the longitudinal section of the first depression portion 1210 described in the embodiments of the present disclosure.

The light-emitting function pattern 122 is disposed on the first electrode 121, the light-emitting function pattern 122 covers at least the first depression portion(s) 1210, and a portion of the light-emitting function pattern 122 covering the first depression portion 1210 is conformal to the first depression portion 1210.

For example, referring to FIGS. 3A, 3B, 3D, 3E, 3G and 3H, the first electrode 121 has one first depression portion 1210, and the light-emitting function pattern 122 only covers the first depression portion 1210.

For another example, referring to FIGS. 3J and 3K, the first electrode 121 has two first depression portions 1210, and the light-emitting function pattern 122 covers the two first depression portions 1210.

For example, the thickness of the first electrode 121 is in a range of 50 nm to 100 nm, inclusive; a thickness of the light-emitting function pattern 122 is in a range of 180 nm to 220 nm, inclusive.

Thus, it can be understood by those skilled in the art that, a description that the light-emitting function pattern 122 covers at least the first depression portion(s) 1210 may be understood that, no matter how many first depression portions 1210 are included in the first electrode 121, the light-emitting function pattern 122 covers each first depression portion 1210. In the case where the light-emitting function pattern 122 covers at least the first depression portion(s) 1210, an area of the light-emitting function pattern 122 is greater than or equal to a total area of the first depression portion(s) 1210 in a direction parallel to the substrate 10.

A description that the portion of the light-emitting function pattern 122 covering the first depression portion 1210 is conformal to the first depression portion 1210 may be understood that, the portion of the light-emitting function pattern 122 covering the first depression portion 1210 has a same shape as the first depression portion 1210.

It will be noted that, those skilled in the art can understand that, the shape of the portion of the light-emitting function pattern 122 covering the first depression portion 1210 is determined by the upper surface (which is proximate to the light-emitting function pattern 122) of the first depression portion 1210. In addition, the thickness of the first electrode 121 is small, and the upper surface and a lower surface of the first depression portion 1210 have substantially same shapes, so that the portion of the light-emitting function pattern 122 covering the first depression portion 1210 has the same shape as the first depression portion 1210.

Based on this, referring to FIGS. 3B, 3E, 3H and 3K, since the first electrode 121 has the first depression portion(s) 1210, in a case where the light-emitting function pattern 122 covers the first depression portion(s) 1210 and the portion of the light-emitting function pattern 122 covering the first depression portion 1210 is conformal to the first depression portion 1210, a surface of the light-emitting function pattern 122 also has depression(s), and the depression(s) each have a same shape as the depression 1200 of a respective first depression portion 1210. Since the surface of the light-emitting function pattern 122 has the depression(s), and the light-emitting function pattern 122 will emit light due to an action of the anode and the cathode, the first depression portion 1210 of the first electrode 121 will cause light 2 emitted by a light-emitting material for fabricating the light-emitting function pattern 122 attached to sidewalls of the first depression portion 1210 to converge toward a middle region of the light-emitting device 12. Therefore, the light 2 emitted by the light-emitting function pattern 122 is more concentrated and luminance of the light is higher.

Figure 3N:
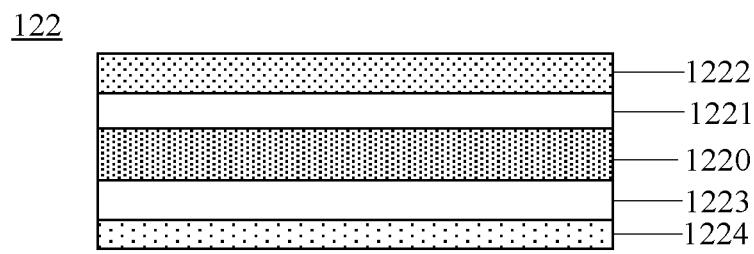
FIG. 3N is a structural diagram of a light-emitting function pattern, in accordance with some embodiments of the present disclosure.

Referring to FIG. 3N, the light-emitting function pattern 122 includes at least a light-emitting pattern 1220. The light-emitting function pattern 122 may further include one or more of an electron transport pattern 1221, an electron injection pattern 1222, a hole transport pattern 1223 and a hole injection pattern 1224.

It will be noted that, FIG. 3N only shows that the light-emitting function pattern 122 includes the light-emitting pattern 1220, electron transport pattern 1221, electron injection pattern 1222, hole transport pattern 1223, and hole injection pattern 1224, and it is not limited that the light-emitting function pattern 122 can only include these patterns. The light-emitting function pattern 122 may further include other pattern(s).

Figure 4A:
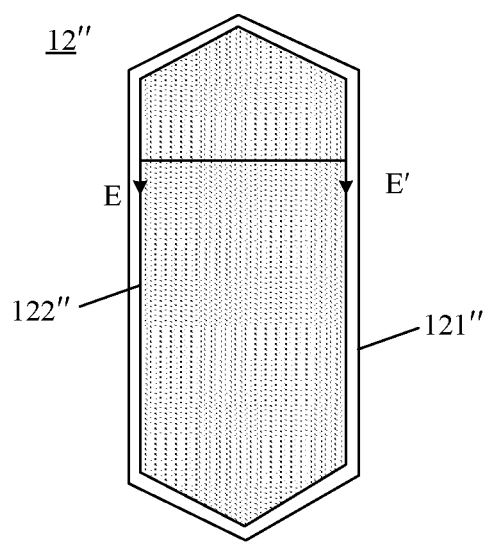
FIG. 4A is a top view showing a structure of a light-emitting device in the related art.
Figure 4B:
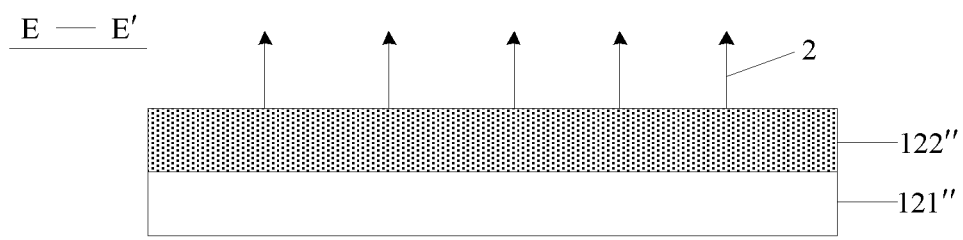
FIG. 4B is a sectional view of the light-emitting device taken along the direction E-E' in FIG. 4A.

Referring to FIGS. 4A and 4B, a light-emitting device 12" in the related art includes, for example, a first electrode 121" and a light-emitting function pattern 122". Shapes of longitudinal sections of the first electrode 121" and the light-emitting function pattern 122" each are rectangular. As a result, light 2 emitted by the light-emitting function pattern 122" are dispersed.

In the embodiments of the present disclosure, the first electrode 121 has the first depression portion(s) 1210, and a surface area of the first electrode 121 may be increased due to the first depression portion(s) 1210; the light-emitting function pattern 122 covers at least the first depression portion(s) 1210, and the portion of the light-emitting function pattern 122 covering the first depression portion 1210 is conformal to the first depression portion 1210. Therefore, on a premise that lengths of first electrodes in the embodiments of the present disclosure and in the related art are the same and widths of the first electrodes are the same, an area of the light-emitting function pattern 122 in the embodiments of the present disclosure is larger than an area of the light-emitting function pattern 122" in the related art. In a case where the area of the light-emitting function pattern 122 is relatively large, it helps generate more light 2, which increases luminance of the light-emitting device 12. In addition, due to the first depression portion 1210, light 2 emitted by a portion of the light-emitting function pattern 122 on the sidewalls of the first depression portion 1210 converges toward the middle region of the light-emitting device 12, which further increases the luminance of the light-emitting device 12. In a case where OLED light-emitting devices are applied to lighting, a lighting device has advantages of soft display and wide color gamut; thus, in a case where the light-emitting devices 12 in the embodiments of the present disclosure are also applied to lighting, the greater the luminance of the light-emitting device 12, the better the lighting effect of the light-emitting device 12. Therefore, it helps reduce the power consumption of various types of lighting devices and prolong the service life of the lighting device. In a case where the light-emitting devices 12 in the embodiments of the present disclosure are applied to the display panel 1, it may be ensured that, the greater the luminance of the light-emitting device 12, the smaller a difference between actual displayed luminance and preset displayed luminance of the display panel 1. Thus, the display effect of the display panel 1 is increased. In addition, since the first electrode 121 of each light-emitting device 12 has the first depression portion(s) 1210, flexibility of the display panel 1 will not be limited by the structure of the light-emitting device 12. Thus, the display panel 1 in the embodiments of the present disclosure may be a flexible display panel.

Figure 5A:
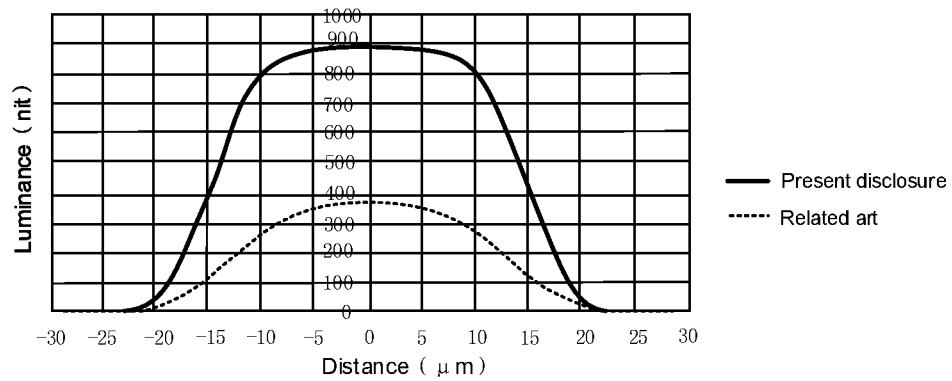
FIG. 5A is a diagram showing a curve between luminance and a distance from a point to a center point of a light-emitting device in the related art and a curve between luminance and a distance from a point to a center point of a light-emitting device in the embodiments of the present disclosure.

For example, referring to FIG. 5A, according to analysis simulation by software, in a case where same parameters (e.g., light viewing angles) of light sources are used, the luminance of the light-emitting device 12 in the embodiments of the present disclosure is overall superior to luminance of the light-emitting device 12" in the related art, and central luminance of the light-emitting device 12 in the embodiments of the present disclosure is much greater than central luminance of the light-emitting device 12" in the related art.

It will be noted that, in FIG. 5A, since a light source is not a surface light source and has a viewing angle, there is a corresponding relationship between the luminance and a distance from a point to a center point of the light-emitting device 12.

Figure 5B:
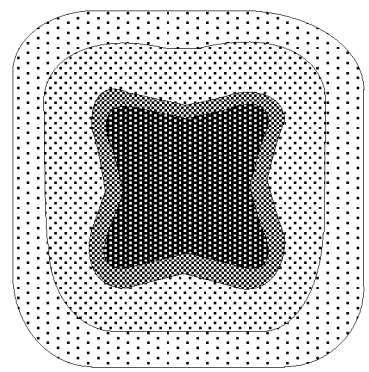
FIG. 5B is a diagram showing a luminance distribution of a light-emitting device in the related art.
Figure 5C:
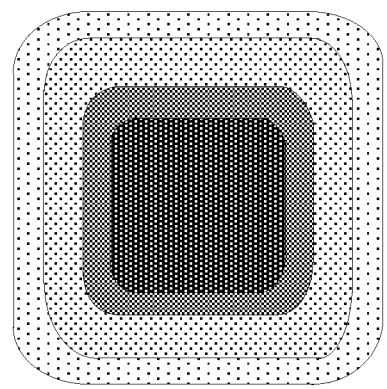
FIG. 5C is a diagram showing a luminance distribution of a light-emitting device, in accordance with some embodiments of the present disclosure.

For another example, according to the analysis simulation by the software, it can be known by comparing luminance distributions of light-emitting devices in FIGS. 5B and 5C that, the luminance of the light-emitting device 12 in the embodiments of the present disclosure is more concentrated in the middle region, and the light-emitting device 12 has a larger light-emitting area and higher luminance. FIG. 5B is a diagram showing a luminance distribution of the light-emitting device 12" in the related art, and FIG. 5C is a diagram showing a luminance distribution of the light-emitting device 12 in the embodiments of the present disclosure. In FIGS. 5B and 5C, the darker the color, the higher the luminance. Therefore, the luminance of the light-emitting devices in both the related art and the embodiments of the present disclosure is decreased outward from the middle region.

A speed of a voltage roll-off of the OLED light-emitting device is fast at a high current density. Therefore, in a case where the area of the light-emitting function pattern 122 is large (that is, the light-emitting area of the light-emitting function pattern 122 is large), the speed of the voltage roll-off may be reduced. As a result, in a case where operating voltages of the light-emitting devices are the same, the luminance of the light-emitting device 12 in the embodiments of the present disclosure is higher than the luminance of the light-emitting device 12" in the related art.

Figure 6A:
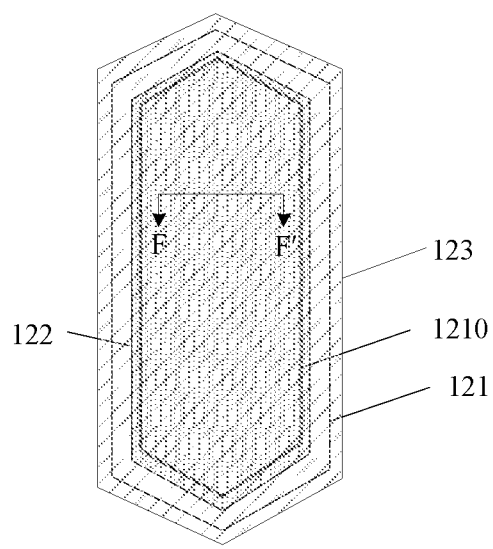
FIG. 6A is a top view showing a structure of yet another light-emitting device, in accordance with some embodiments of the present disclosure.
Figure 6B:
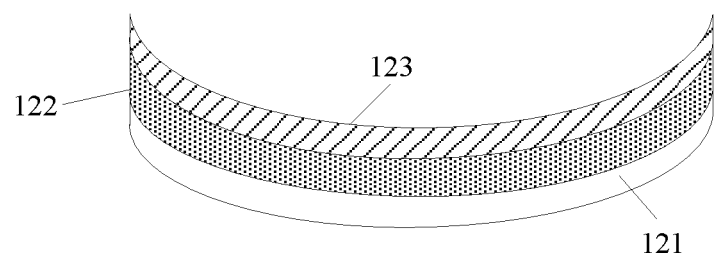
FIGS. 6B and 6C each are a sectional view of the light-emitting device taken along the direction F-F' in FIG. 6A.
Figure 6C:
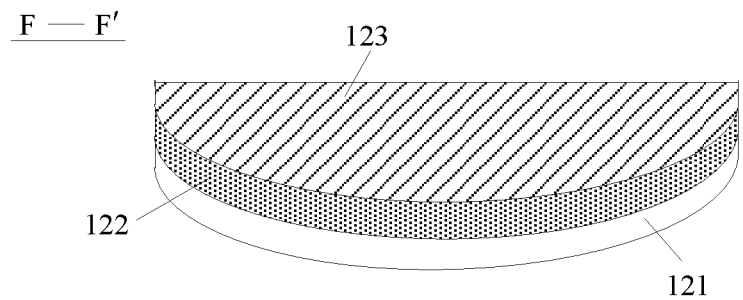

In some embodiments, referring to FIGS. 6A to 6C, the light-emitting device 12 further includes a second electrode 123. The second electrode 123 is disposed opposite to the first electrode 121, and the light-emitting function pattern 122 is located between the first electrode 121 and the second electrode 123.

For example, the second electrode 123 is the cathode. The second electrode 123 is made of, for example, a metal material such as silver (Ag), or aluminum (Al).

The first electrode 121 and the second electrode 123 are configured to provide voltage signals, so that the light-emitting function pattern 122 may emit the light 2. For example, the first electrode 121 is used for providing an anode voltage, and the second electrode 123 is used for providing a cathode voltage.

In some embodiments, the display panel 1 has the plurality of sub-pixels P emitting light of different colors. In the sub-pixels P, at least part of sub-pixels P emitting blue light each include the light-emitting device 12.

The colors of the light are, for example, three primary colors such as red, green, and blue. Light-emitting efficiency of a sub-pixel emitting blue light is lower than light-emitting efficiency of a sub-pixel emitting red light and light-emitting efficiency of a sub-pixel emitting green light. Therefore, the light-emitting device 12 included in the sub-pixel emitting blue light has the first depression portion 1210, which may increase the light-emitting efficiency of the sub-pixel emitting blue light, and thus ameliorate the display effect of the display panel 1.

In embodiments of the present disclosure, first electrodes 121 of light-emitting devices 12 in part of the sub-pixels each may have the first depression portion(s) 1210, so that light-emitting efficiency of a certain type of sub-pixels P each of which includes the first electrode 121 having the first depression portion(s) 1210 may be ameliorated. Therefore, by adjusting a luminous ratio of the sub-pixels emitting light of different colors, it may be possible to make the display panel in the embodiments of the present disclosure emit light 2 of an arbitrary color. As a result, the display panel 1 may have a wider range of applications.

Figure 7A:
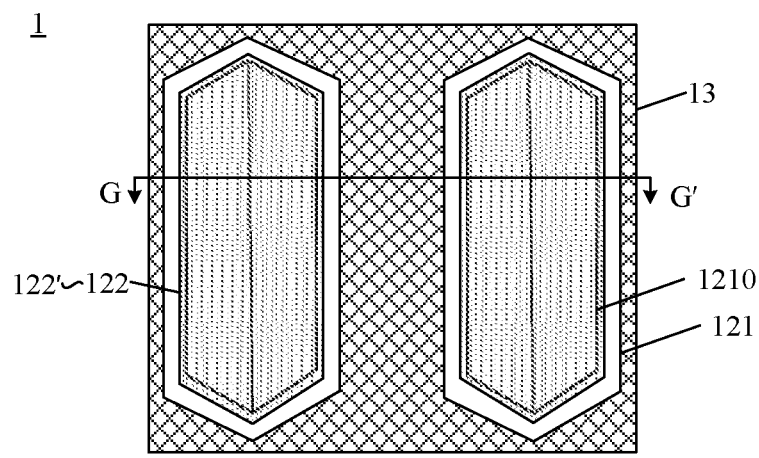
FIG. 7A is a top view showing a structure of another light-emitting device, in accordance with some embodiments of the present disclosure.
Figure 7B:
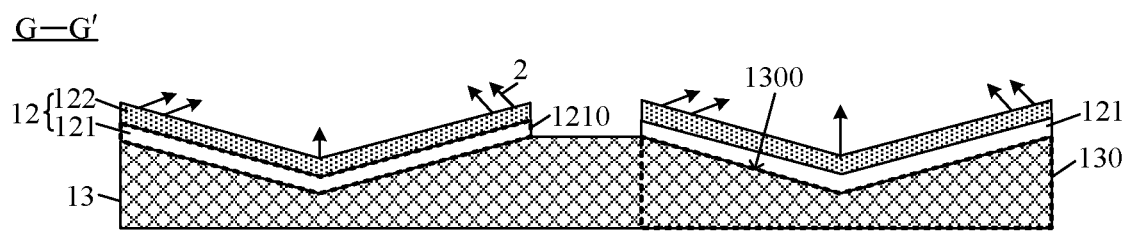
FIG. 7B is a sectional view of the light-emitting device taken along the direction G-G' in FIG. 7A.

In some embodiments, referring to FIGS. 7A and 7B, the display panel 1 further includes a planarization layer 13 disposed on a side of the first electrodes 121 away from light-emitting function patterns 122. The planarization layer 13 includes a plurality of second depression portions 130, the first depression portion 1210 is located on a second depression portion 130, and a surface of the first depression portion 1210 proximate to the second depression portion 130 is conformal to a surface of the second depression portion 130 proximate to the first depression portion 1210.

Referring to FIG. 7B, a surface of the planarization layer 13 proximate to the light-emitting devices 12 has a plurality of depressions 1300, and the light-emitting device 12 is located in one of the depressions 1300. Therefore, a portion of the first electrode 121 covering the second depression portion 130 is conformal to an upper surface of the second depression portion 130. That is, a surface of the first depression portion 1210 proximate to the second depression portion 130 (the lower surface of the first depression portion 1210) is conformal to a surface of the second depression portion 130 proximate to the first depression portion 1210 (the upper surface of the second depression portion 130).

Since it is needed to form the first depression portions 1210 in the first electrodes 121, in a process of manufacturing the light-emitting devices 12, the second depression portions 130 in the planarization layer 13 are firstly formed, and then the first electrodes 121 are formed on the planarization layer 13. Each first electrode 121 includes the at least one first depression portion 1210, and each first depression portion 1210 has a same shape as an upper surface of a respective second depression portion 130.

For example, the planarization layer 13 is made of a photosensitive material, such as photosensitive polyimide (PI) or photosensitive photoresist. A film layer made of the photosensitive material may be patterned by a mask, and a patterning process is simple. Therefore, in the case where the planarization layer 13 is made of the photosensitive material, the second depression portions 130 are easy to be fabricated.

For example, firstly, the substrate 10 is coated with the photosensitive PI to form a planarization film; then, the planarization film is exposed by using ultraviolet light passing through the mask. The mask is provided with a plurality of openings therein, and each opening is used for fabricating a respective second depression portion 130 in a subsequent process. When the ultraviolet light passes through the opening, a shadow region is formed at a periphery of the opening, and an amount of ultraviolet light received in the shadow region is different from an amount of ultraviolet light received in a middle region of the opening. The amount of the ultraviolet light received in the middle region of the opening is the largest. Finally, the planarization film is subjected to a developing solution treatment. Since the planarization film is cured in different degrees corresponding to each opening from the middle region to the edge region, the planarization layer 13 having the second depression portions 130 may be obtained after the development.

For example, in a process of irradiating the opening with the ultraviolet light, an inclination angle exists between the ultraviolet light and the opening, the inclination angle is not equal to 90 degrees, and the ultraviolet light moves with respect to the mask during the irradiation. Thus, it may be ensured that the amount of ultraviolet light received in regions on two opposite sides of the opening is substantially the same, thereby ensuring that the second depression portion 130 having a symmetrical structure may be formed.

Figure 8:
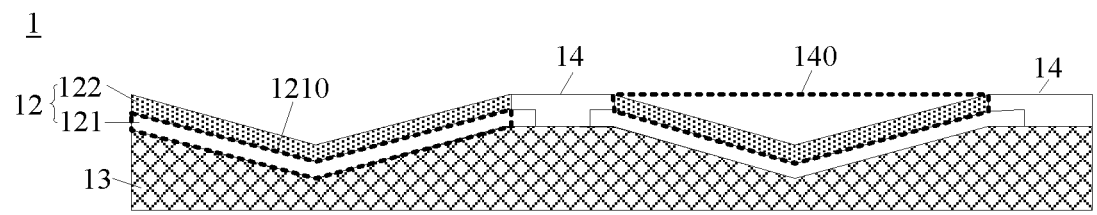
FIG. 8 is a longitudinal section view showing a structure of yet another display panel, in accordance with some embodiments of the present disclosure.

In some embodiments, referring to FIG. 8, the display panel 1 further includes a pixel defining layer 14 disposed on the first electrodes 121 of the light-emitting devices 12. The pixel defining layer 14 includes a plurality of hollows 140. A hollow 140 in the plurality of hollows 140 exposes at least the first depression portion(s) 1210 of one first electrode 121.

The pixel defining layer 14 is made of a photosensitive organic material, such as photoresist.

In a process of manufacturing the display panel 1, after the first electrodes 121 are fabricated, it is needed to fabricate the pixel defining layer 14. In a process of fabricating the pixel defining layer 14, it is also needed to use a patterning process to form the plurality of hollows 140 of the pixel defining layer 14, each hollow 140 exposing at least the first depression portion(s) 1210 of the respective first electrode 121.

For example, referring to FIG. 8, the first electrode 121 has one first depression portion 1210, and a hollow 140 of the pixel defining layer 14 corresponding to the first electrode 121 exposes at least the first depression portion 1210 of the first electrode 121.

It will be noted that, referring to FIG. 3K, in a case where the first electrode 121 has two first depression portions 1210, the hollow 140 of the pixel defining layer 14 corresponding to the first electrode 121 exposes at least the two first depression portions 1210 of the first electrode 121.

In summary, a description that each hollow 140 exposes at least the first depression portion(s) 1210 of the first electrode 121 may be understood that, each hollow 140 exposes at least a portion of the first electrode 121, and the portion of the first electrode 121 includes all of the first depression portion(s) 1210.

The pixel defining layer 14 is used to define a position of the light-emitting function pattern 122, so that a structure and position of the light-emitting device 12 formed in the display panel 1 conform to a design drawing.

In some embodiments, second electrodes 123 of the plurality of light-emitting devices 12 are coupled.

Figure 10A:
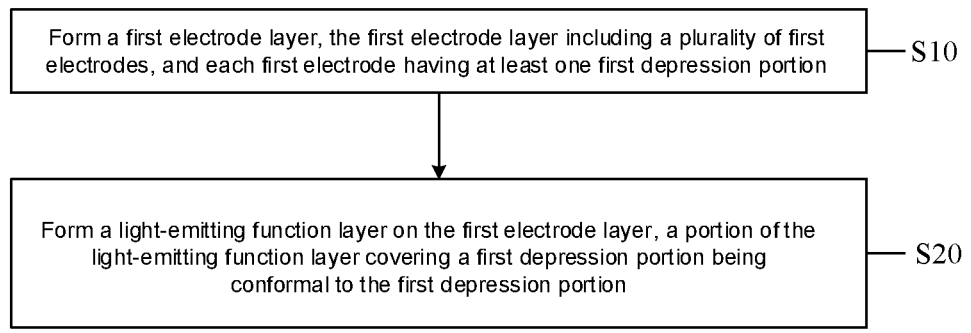
FIG. 10A is a flow diagram of a manufacturing method of a display panel, in accordance with some embodiments of the present disclosure.
Figure 10B:
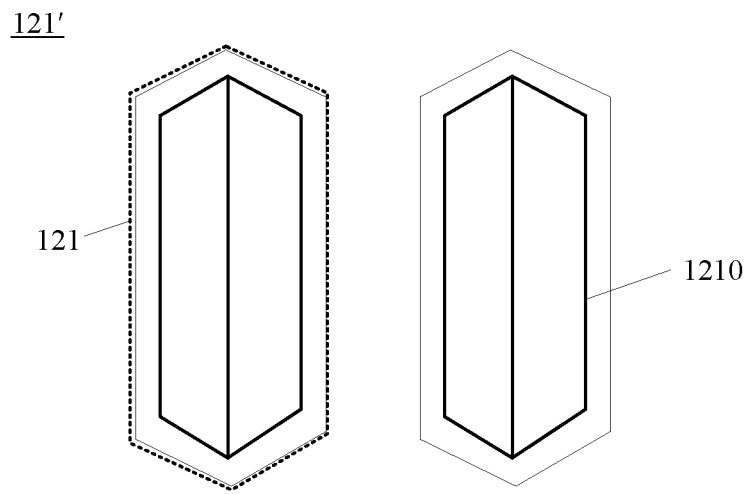
FIG. 10B is a top view showing a structure of a first electrode layer in a manufacturing process of a display panel, in accordance with some embodiments of the present disclosure.
Figure 10C:
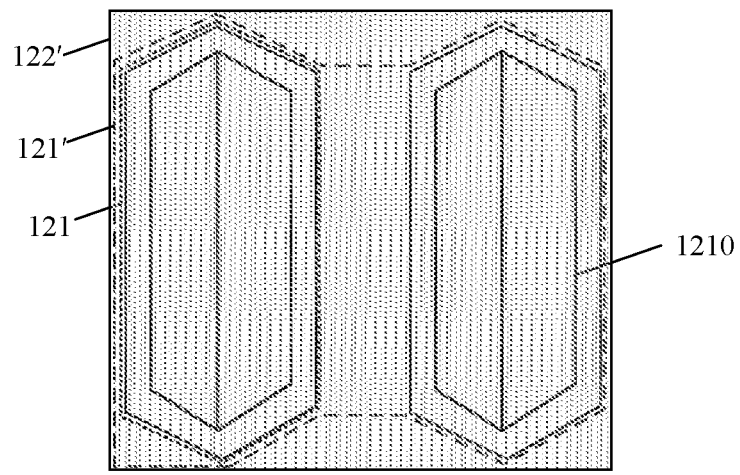
FIG. 10O is a top view showing a structure of a light-emitting function layer in a manufacturing process of a display panel, in accordance with some embodiments of the present disclosure.
FIG. 10D is a longitudinal section view showing a structure of a first electrode layer in a manufacturing process of a display panel, in accordance with some embodiments of the present disclosure.
FIG. 10E is a longitudinal section view showing a structure of a pixel defining layer in a manufacturing process of a display panel, in accordance with some embodiments of the present disclosure.
FIG. 10F is a longitudinal section view showing a structure of a second electrode layer in a manufacturing process of a display panel, in accordance with some embodiments of the present disclosure.
Figure 10D:
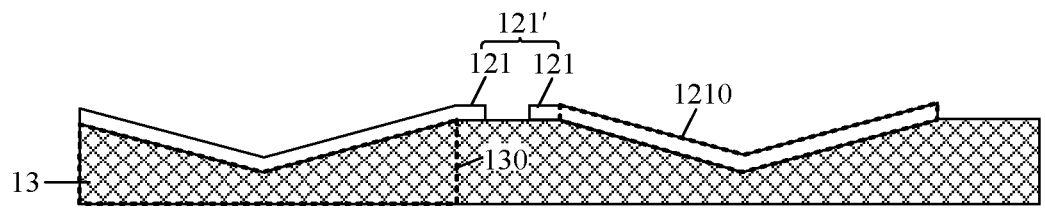
Figure 10E:
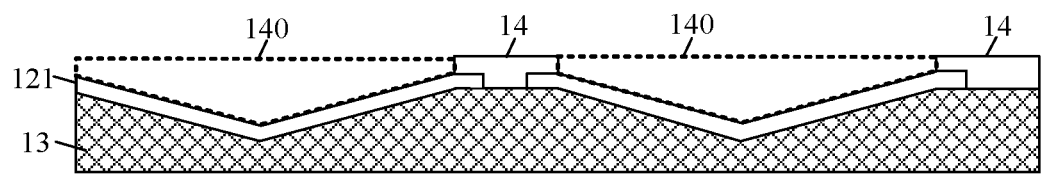
Figure 10F:
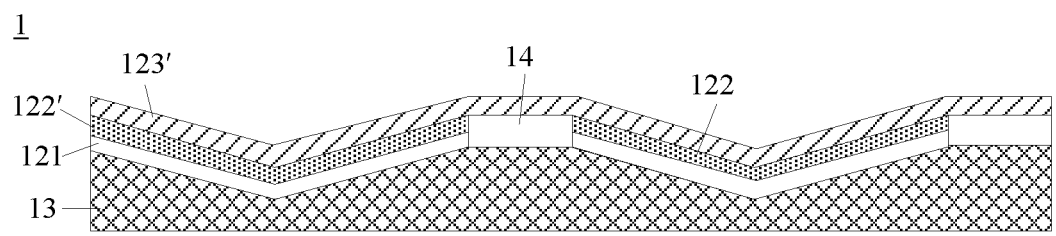

For example, as shown in FIG. 10F, the display panel 1 includes a second electrode layer 123', and the second electrode layer 123' does not need to be patterned. In a case where the second electrode layer 123' is not patterned, the second electrodes 123 may not be actually distinguished in the second electrode layer 123', but those skilled in the art can understand that, a portion of the second electrode layer 123' corresponding to each first electrode 121 serves as the second electrode 123, and a remaining portion of the second electrode layer 123' may serve as a connection portion for coupling adjacent second electrodes 123.

For another example, the second electrode layer 123' is a cathode layer.

In the case where the second electrodes 123 are coupled, the second electrode layer 123' may be directly fabricated without patterning, and the fabricating process is simple.

Figure 9A:
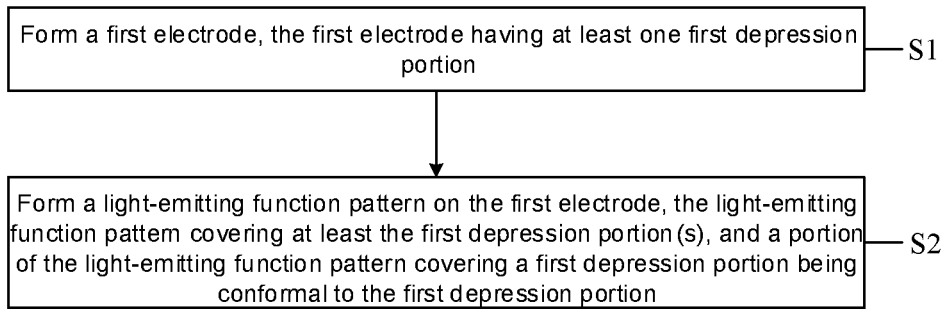
FIG. 9A is a flow diagram of a manufacturing method of a light-emitting device, in accordance with some embodiments of the present disclosure.

Referring to FIG. 9A, embodiments of the present disclosure provide a manufacturing method of a light-emitting device 12, which includes the following steps (S1 and S2).

In S1, referring to FIGS. 3C, 3F, 3I and 3L, a first electrode 121 is formed, and the first electrode 121 has at least one first depression portion 1210.

In S2, referring to FIGS. 3A, 3B, 3D, 3E, 3G, 3H, 3J and 3K, a light-emitting function pattern 122 is formed on the first electrode 121, the light-emitting function pattern 122 covers at least the first depression portion(s) 1210, and a portion of the light-emitting function pattern 122 covering the first depression portion 1210 is conformal to the first depression portion 1210.

Beneficial effects of the manufacturing method of the light-emitting device 12 is the same as beneficial effects of the light-emitting device 12 described above, which will not be repeated here.

Figure 9B:
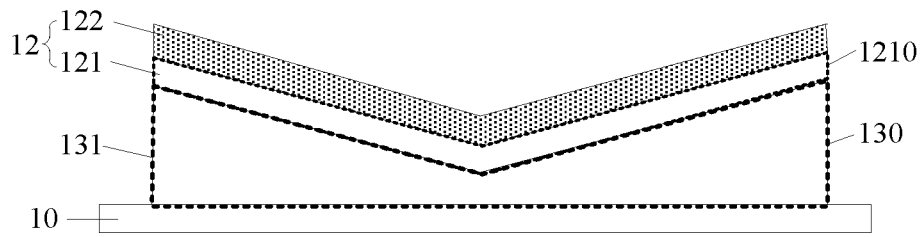
FIG. 9B is a diagram showing a structure of a light-emitting device in a manufacturing process, in accordance with some embodiments of the present disclosure.

In some embodiments, referring to FIG. 9B, before the first electrode 121 is formed, the manufacturing method of the light-emitting device 12 further includes: forming a planarization pattern 131. The planarization pattern 131 includes at least one second depression portion 130, the first depression portion 1210 is located on a second depression portion 130, and a surface of the first depression portion 1210 proximate to the second depression portion 130 is conformal to a surface of the second depression portion 130 proximate to the first depression portion 1210.

For example, a thickness of the planarization pattern 131 is 100 micrometers.

The planarization pattern 131 is made of, for example, photosensitive polyimide. The planarization pattern 131 having the second depression portion(s) 130 may be fabricated by patterning a film made of polyimide. Since the thickness of the planarization pattern 131 is much greater than a thickness of the first electrode 121, the planarization pattern 131 is easier to be patterned.

It can be understood by those skilled in the art that, in the process of manufacturing the light-emitting device 12, a carrier is needed. The carrier may be, for example, a substrate 10. Film layers of the light-emitting device 12 are fabricated on the substrate 10. For example, referring to FIG. 9B, the planarization pattern 131 is disposed on the substrate 10, the substrate 10 being made of glass; the first electrode 121 is disposed on the planarization pattern 131 (i.e., disposed on a side of the planarization pattern 131 away from the substrate 10); and the light-emitting function pattern 122 is disposed on the first electrode 121.

The planarization pattern 131 having the second depression portion(s) 130 is firstly formed, and then the first electrode 121 is formed on the planarization pattern 131. Thus, the first electrode 121 may have the first depression portion(s) 1210. For example, the first electrode 121 is formed by magnetron sputtering, so that a material for forming the first electrode 121 is deposited on the second depression portion(s) 130. As a result, the first depression portion(s) 1210 are finally formed.

In some embodiments, referring to FIGS. 6A to 6C, the manufacturing method of the light-emitting device 12 further includes:

forming a second electrode 123 on the light-emitting function pattern 122, the second electrode 123 being disposed opposite to the first electrode 121.

The second electrode 123 is made of, for example, silver. The second electrode 123 is formed, for example, by magnetron sputtering.

A description that the second electrode 123 is disposed opposite to the first electrode 121 may be understood that, in a thickness direction of the light-emitting device 12, an orthographic projection of the second electrode 123 on the first electrode 121 is at least partially overlapped with the first electrode 121.

For example, the second electrode 123 is configured to provide a cathode voltage to the light-emitting device 12, so as to ensure a normal operation of the light-emitting device 12.

Referring to FIG. 10A, embodiments of the present disclosure further provide a manufacturing method of a display panel 1. The manufacturing method includes the following steps (S10 and S20).

In S10, referring to FIG. 10B, a first electrode layer 121' is formed. The first electrode layer 121' includes a plurality of first electrodes 121, and each of the first electrodes 121 has at least one first depression portion 1210.

For example, referring to FIG. 10B, the plurality of first electrodes 121 are relatively independent and not coupled.

In S20, referring to FIGS. 7A and 10O, a light-emitting function layer 122' is formed on the first electrode layer 121', and a portion of the light-emitting function layer 122' covering the first depression portion 1210 is conformal to the first depression portion 1210.

Referring to FIG. 7A, the light-emitting function layer 122' includes a plurality of light-emitting function patterns 122. A light-emitting function pattern 122 covers at least the first depression portion(s) 1210 of a first electrode 121, and a portion of the light-emitting function pattern 122 covering the first depression portion 1210 is conformal to the first depression portion 1210.

Alternatively, referring to FIG. 10O, the light-emitting function layer 122' covers the first electrode layer 121' as a whole layer, and a portion of the light-emitting function layer 122' covering the first depression portion 1210 is conformal to the first depression portion 1210. In this case, the light-emitting function layer 122' has a plurality of depression portions each having a same shape as the first depression portion 1210.

Referring to FIG. 10O, it can be understood by those skilled in the art that, in a case where the light-emitting function layer 122' covers the first electrode layer 121' as the whole layer, it may also be considered that the light-emitting function layer 122' includes the plurality of light-emitting function patterns 122. An orthographic projection of each light-emitting function pattern 122 on the first electrode 121 covers the first depression portion(s) 1210 of the first electrode 121, and the plurality of light-emitting function patterns 122 are connected.

In some embodiments, referring to FIG. 10D, the manufacturing method of the display panel 1 further includes:

forming a planarization layer 13 before the first electrode layer 121' is formed, the planarization layer 13 including a plurality of second depression portions 130, the first depression portion 1210 being located on a second depression portion 130 in the plurality of second depression portions 130, and a surface of the first depression portion 1210 proximate to the second depression portion 130 being conformal to a surface of the second depression portion 130 proximate to the first depression portion 1210.

For example, referring to FIG. 10D, by forming the second depression portions 130 in the planarization layer 13, the first depression portions 1210 are formed. That is, a shape of the first depression portion 1210 is determined by the second depression portion 130.

In some embodiments, forming the planarization layer 13 includes: forming a planarization film of a photosensitive material, and patterning the planarization film to form the planarization layer 13 including the plurality of second depression portions 130.

Since the planarization film of the photosensitive material may be patterned by using a mask in combination with exposure, the planarization layer 13 may be fabricated relatively easily by directly fabricating the planarization film using the photosensitive material.

In some embodiments, patterning the planarization film to form the plurality of second depression portions 130 includes: exposing regions of the planarization film where the second depression portions 130 are to be formed.

In some embodiments, in an exposure process, an exposure time for a middle region in each region where the second depression portion is to be formed is longer than an exposure time for an edge region except for the middle region in the region where the second depression portion is to be formed.

In some other embodiments, in the exposure process, an exposure intensity for the middle region in each region where the second depression portion is to be formed is greater than an exposure intensity for the edge region except for the middle region in the region where the second depression portion is to be formed.

The second depression portion 130 may be finally formed in each region where the second depression portion is to be formed.

A thickness of a middle region of the second depression portion 130 is less than a thickness of an edge region of the second depression portion 130. Therefore, in the exposure process, the longer the exposure time and/or the stronger the exposure intensity for the middle region in the region where the second depression portion is to be formed, the more the photosensitive material that can be removed in a subsequent etching process, thereby forming the second depression portions 130 that meets a design requirement. For the photosensitive material in the embodiments of the present disclosure, the longer the exposure time or the stronger the exposure intensity, the greater an amount of the photosensitive material that can be removed.

In some embodiments, referring to FIG. 10E, before the light-emitting function layer 122' is formed, the manufacturing method of the display panel 1 further includes: forming a pixel defining layer 14. The pixel defining layer 14 includes a plurality of hollows 140, and each hollow 140 exposes at least the first depression portion(s) 1210 of the first electrode 121.

In some embodiments, referring to FIG. 10F, after the light-emitting function layer 122' is formed, the manufacturing method of the display panel 1 further includes: forming a second electrode layer 123' on the light-emitting function layer 122'. The second electrode layer 123' is opposite to the first electrode layer 121'.

Referring to FIG. 10F, the second electrode layer 123' covers the light-emitting function layer 122' as a whole layer.

A portion, whose orthographic projection is overlapped with the first electrode 121, of the second electrode layer 123' may be understood as the second electrode 123. A portion of the light-emitting function layer 122' located in the hollow 140 may emit light due to an action of the first electrode layer 121' and the second electrode layer 123'. Therefore, the portion of the light-emitting function layer 122' located in the hollow 140 may be understood as the light-emitting function pattern 122.

In some embodiments, referring to FIGS. 3B, 3E, 3H and 3K, in a thickness direction of the display panel 1, an edge of a longitudinal section of the first depression portion 1210 proximate to the light-emitting function layer 122' includes an arc line and/or polyline.

In some embodiments, referring to FIGS. 3B, 3E, 3H and 3K, a surface of the first depression portion 1210 proximate to the light-emitting function layer 122' has a depression 1200. In the thickness direction of the display panel 1, a section of the depression 1200 of the first depression portion 1210 is in a shape of any one of a semicircle, a semi-ellipse, an inverted triangle, an inverted trapezoid and a rectangle.

In a case where a shape of a longitudinal section of the first depression portion 1210 is any one of these shapes, it helps fabricate the first depression portion 1210.

Based on the above, the light-emitting device 12 and the display panel 1 in the embodiments of the present disclosure each include the first electrode 121, and the first electrode 121 has at least one first depression portion 1210. The first depression portion 1210 may increase an area of the light-emitting function pattern 122 and make the light 2 emitted by the light-emitting function pattern 122 converge toward the center of the first depression portion 1210, thereby improving the luminance of the light-emitting device 12 and the display panel 1.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel, comprising at least one light-emitting device wherein a light-emitting device of the at least one light-emitting device comprises:
   a first electrode having at least one first depression portion;
   a light-emitting function pattern disposed on the first electrode, the light-emitting function pattern covering at least the at least one first depression portion, and a portion of the light-emitting function pattern covering a first depression portion being conformal to the first depression portion;
   wherein the at least one light-emitting device includes a plurality of light-emitting devices; and
   the display panel further comprises a pixel defining layer disposed on first electrodes of the plurality of light-emitting devices, wherein the pixel defining layer is configured to define a position of the light-emitting function pattern, the pixel defining layer includes a plurality of hollows, and a hollow in the plurality of hollows exposes at least the at least one first depression portion of the first electrode.

2. The display panel according to claim 1, wherein in a thickness direction of the light-emitting device, an edge of a longitudinal section of the first depression portion proximate to the light-emitting function pattern includes an arc line and/or polyline.

3. The display panel according to claim 2, wherein a surface of the first depression portion proximate to the light-emitting function pattern has a depression; and in the thickness direction of the light-emitting device, a section of the depression of the surface of the first depression portion is in a shape of any one of a semicircle, a semi-ellipse, an inverted triangle, an inverted trapezoid and a rectangle.

4. The display panel according to claim 1, further comprising a second electrode disposed opposite to the first electrode, the light-emitting function pattern being located between the first electrode and the second electrode.

5. The display panel according to claim 1, wherein the display panel has a plurality of sub-pixels emitting light of different colors; and in the sub-pixels, at least part of sub-pixels emitting blue light each include a light-emitting device in the at least one light-emitting device.

6. The display panel according to claim 1, wherein
the display panel further comprises a planarization layer disposed on a side of first electrodes of the plurality of light-emitting devices away from light-emitting function patterns of the plurality of light-emitting devices, wherein the planarization layer includes a plurality of second depression portions, the first depression portion is located on a second depression portion in the plurality of second depression portions, and a surface of the first depression portion proximate to the second depression portion is conformal to a surface of the second depression portion proximate to the first depression portion.

7. The display panel according to claim 6, wherein the planarization layer is made of a photosensitive material.

8. The display panel according to claim 1, wherein second electrodes of the light-emitting devices are coupled.

9. A display apparatus, comprising the display panel according to claim 1.

10. A manufacturing method of a display panel, comprising:
forming a first electrode layer, the first electrode layer including a plurality of first electrodes, and each first electrode in the plurality of first electrodes having at least one first depression portion; and
forming a light-emitting function layer on the first electrode layer, wherein the light-emitting function layer includes a plurality of light-emitting function patterns, a light-emitting function pattern in the plurality of light-emitting function patterns covers at least the at least one first depression portion of a first electrode, and a portion of the light-emitting function pattern covering a first depression portion is conformal to the first depression portion;
wherein after forming the first electrode layer, the manufacturing method further comprises:
forming a pixel defining layer on the plurality of first electrodes, wherein the pixel defining layer is configured to define a position of the light-emitting function pattern, the pixel defining layer includes a plurality of hollows, and a hollow in the plurality of hollows exposes at least the at least one first depression portion of the first electrode.

11. The manufacturing method of the display panel according to claim 10, before forming the first electrode layer, the manufacturing method further comprising:
forming a planarization layer, wherein the planarization layer includes a plurality of second depression portions, the first depression portion is located on a second depression portion in the plurality of second depression portion, and a surface of the first depression portion proximate to the second depression portion is conformal to a surface of the second depression portion proximate to the first depression portion.

12. The manufacturing method of the display panel according to claim 11, wherein forming the planarization layer includes:
forming a planarization film of a photosensitive material, and
patterning the planarization film to form the planarization layer including the plurality of second depression portions.

13. The manufacturing method of the display panel according to claim 12, wherein patterning the planarization film to form the planarization layer including the plurality of second depression portions, includes:
exposing regions of the planarization film where the second depression portions are to be formed, wherein
in an exposure process, an exposure time for a middle region in each region where the second depression portion is to be formed is longer than an exposure time for an edge region except for the middle region in the region where the second depression portion is to be formed; or an exposure intensity for the middle region in each region where the second depression portion is to be formed is greater than an exposure intensity for the edge region except for the middle region in the region where the second depression portion is to be formed.

14. The manufacturing method of the display panel according to claim 10, after forming the light-emitting function layer, the method further comprising:
forming a second electrode layer on the light-emitting function layer, the second electrode layer being opposite to the first electrode layer.

15. The manufacturing method of the display panel according to claim 10, wherein in a thickness direction of the display panel, an edge of a longitudinal section of the first depression portion proximate to the light-emitting function layer includes an arc line and/or polyline.

* * * * *